US008488640B2

(12) United States Patent
Peters et al.

(10) Patent No.: US 8,488,640 B2
(45) Date of Patent: Jul. 16, 2013

(54) INTEGRATED OPTICAL COMB SOURCE SYSTEM AND METHOD

(75) Inventors: Frank Peters, Cork (IE); Andrew Ellis, Cork (IE)

(73) Assignee: University College Cork, Cork (IE)

(*) Notice: Subject to any disclaimer, the term of this patent is extended or adjusted under 35 U.S.C. 154(b) by 0 days.

(21) Appl. No.: 12/574,582

(22) Filed: Oct. 6, 2009

(65) Prior Publication Data

US 2010/0135346 A1 Jun. 3, 2010

Related U.S. Application Data

(60) Provisional application No. 61/102,946, filed on Oct. 6, 2008.

(30) Foreign Application Priority Data

Oct. 6, 2008 (EP) .................................. 08105496

(51) Int. Cl.
H01S 3/10 (2006.01)
H01S 3/13 (2006.01)

(52) U.S. Cl.
USPC ............ 372/29.011; 372/26; 372/28; 372/32

(58) Field of Classification Search
USPC ... 372/29.011, 18, 26, 29.016, 28, 32; 385/24
See application file for complete search history.

(56) References Cited

U.S. PATENT DOCUMENTS

| 4,989,201 A | 1/1991 | Glance |
| 5,365,361 A | 11/1994 | Noll et al. |
| 6,418,152 B1 * | 7/2002 | Davis ............................. 372/18 |
| 2004/0160994 A1 * | 8/2004 | Zhang ............................. 372/23 |
| 2005/0036734 A1 * | 2/2005 | Zami ............................. 385/24 |

FOREIGN PATENT DOCUMENTS

| EP | 0 582 061 A | 2/1994 |
| EP | 582061 A1 * | 2/1994 |
| EP | 0 758 169 A | 2/1997 |
| WO | WO 2007/043032 A | 4/2007 |

OTHER PUBLICATIONS

The extended European Search Report dated Mar. 12, 2009 for European Patent Application No. 08105496.7.
Healy et al. "Phase Stabilisation of Coherent WDM Modulator Array." *Proc. OFC'06, Paper OTuI5* (2006).
Garcia Gunning et al. "0.6Tbit/s Capacity and 2bit/s/Hz Spectral Efficiency at 42.6Gsymbol/s Using a Single DFB Laser with NRZ Coherent WDM and Polarisation Multiplexing." *CLEO Europe 2007*, Munich, Germany. Paper CI8-5 (2007).

* cited by examiner

*Primary Examiner* — Armando Rodriguez
(74) *Attorney, Agent, or Firm* — Knobbe Martens Olson & Bear LLP

(57) ABSTRACT

The present invention provides a system and method for creating a coherent optical comb comprising a plurality of lasers, each laser providing an optical output channel; means for combining each optical channel output; a modulator for modulating the combined optical channel outputs, to provide a modulated signal; means for feeding back said modulated signal to said plurality of lasers, such that each laser output channel is phase and/or frequency locked with respect to at least one other of said plurality of lasers. A discrete optical comb is obtained without the need for excessively high power laser outputs and only employs a single (optional) wavelength locker for all channels.

12 Claims, 2 Drawing Sheets

Optical comb generated from mode locked laser

INTEGRATED OPTICAL COMB SOURCE SYSTEM AND METHOD

CROSS-REFERENCES TO RELATED APPLICATIONS

This application claims priority under 35 U.S.C. §119 to U.S. Provisional Application No. 61/102,946 and European Patent Application No. 08105496.7, both of which were filed Oct. 6, 2008 and are incorporated herein by reference in their entirety.

BACKGROUND

1. Field

This disclosure relates to a system and method capable of generating a coherent comb of optical wavelengths. Embodiments described herein are particularly suitable to enable high spectral density communications with carriers spaced at orthogonal frequencies, such as Coherent WDM.

2. Description of Related Technologies

Coherent WDM (Wave Division Multiplexing) are techniques applied to communication systems to achieve high information spectral density (ISD). In Coherent WDM, and optionally in OFDM and its derivatives, the relative optical phase of signals carried on adjacent wavelengths is fixed, such that any interference effects, which impact the channels, are also fixed, and may be beneficially used to enhance the system performance.

Prior art coherent WDM systems typically employ a single mode laser connected to an optical modulator, for example using two or more Mach-Zehnder devices, typically in a cascaded arrangement, to produce a plurality of sidebands or channels, as shown in FIG. 1.

PCT patent publication number WO2007043032, assigned to University College Cork, discloses a transmitter that transmits signals on multiple channels and can be wavelength multiplexed according to Coherent WDM. The quality of the received signals is very much enhanced by the transmitter tuning the relative phases of neighbouring channels according to delay characteristics of the optical path. In one example, the transmitter adds a relative phase shift of $\pi/2$ between adjacent carriers and furthermore the resultant beat frequency signal for the odd and even channel groups are time aligned with their respective data signals to counter the receiver side delays introduced by optical and electrical filtering devices. Since the adjacent sub carriers are added interferometrically the relative phases may be set any particular desired value by monitoring either the total power or the phase dependant amplitudes of the beat frequency between them. These effects are discussed in more detail in two papers published by T. Healy, F. C. G. Gunning, A. D. Ellis, "Phase Stabilisation of Coherent WDM Modulator Array", Proc OFC'06, Paper OTuI5, (2006) and F. C. Garcia Gunning. T. Healy, X. Yang, A. D. Ellis, "0.6 Tbit/s Capacity and 2 bit/s/Hz Spectral Efficiency at 42.6 Gsymbol/s Using a Single DFB Laser with NRZ Coherent WDM and Polarisation Multiplexing", CLEO Europe 2007, Munich, Germany, paper CI8-5, (2007).

Any harmonics or sub-harmonics will similarly vary with phase and therefore can also be used as an error signal for a phase stabilisation circuit. The phase stabilisation circuit in the transmitter therefore can maintain a desired stable optimum phase alignment between neighbouring channels or sub-bands without the need for feedback from the receiver.

Recent trends in the telecommunication industry demands that telecommunication providers require adequate optical signal to noise ratio's (OSNR) within the transmitter to provide sufficient margin for subsequent transmission. A transmitter OSNR well in excess of 35 dB is needed to ensure less than 0.25 dB penalty for a carrier transmitting a signal at a rate of 40 Gbaud. Values in excess of 45 dB would be more typical. Given the fixed noise levels of optical booster amplifiers, this corresponds to a launch power from an optical sub assembly of 500 µW for each coherent WDM subcarrier. Employing typical modulator based optical comb generators divides the power of a single high power laser between the modes, for example ten modes, and presents a minimum excess insertion loss of 4 dB loss per Mach-Zehnder device. These modes are then separated using filtering devices, with additional excess loss (typically greater than 2 dB). These losses are in addition to the losses associated with the electro-optic modulator necessary to encode the data (typically greater than 4 dB), and losses associated with the recombination of the signals (typically greater than 3 dB). The result of which is, that if a single high power laser is employed, a minimum laser output power in excess of 100 mW is necessary in order to achieve a launch power of 500 µW per channel into a booster amplifier. In practice the total required power is significantly in excess of these values, and so additional optical power amplifiers are used within the transmitter sub assembly, adding to the cost, size, complexity and power consumption of the transmitter. These launch power considerations are enhanced if a booster amplifier is not employed and the transmitter sub assembly is required to drive the communications link directly.

Additional problems are associated with the difficulty of integration of such high power components with high performance Mach-Zehnder modulators, the number of modes generated (e.g. 7, 9, 11, 13) wasted power associated with undesirable side modes and power equalization, the necessity to demultiplex the modes prior to modulation and the excess loss of phase control elements.

A possible solution to avoid the excess loss associated with the comb generating Mach-Zehnder modulators is to use an alternative comb source, such as a mode-locked laser which produces a very broad optical comb as shown in FIG. 2. However a problem with this approach is that it is very difficult to simultaneously obtain the required mode power, compact size, precisely set operating frequency and power distribution. For WDM solutions, the optical comb has far too many undesirable modes, which will need to be filtered out, and this means that the efficiency of the source is very poor. Furthermore, as with the cascaded modulator solution, there is also no way to modulate or select individual lines from within the comb generator without the use of an external optical demultiplexer.

There is currently no demonstrated way to generate the required comb signal required in the telecommunication industry from a compact, or integrated source. Embodiments disclosed herein are directed to providing a solution to the above mentioned problems.

SUMMARY

In one embodiment, there is provided, as set out in the appended claims, a system for providing a coherent optical comb comprising a plurality of lasers, each laser providing an optical output channel; means for combining each optical channel output; a modulator for modulating the combined optical channel outputs, to provide a modulated signal; and means for feeding back said modulated signal to said plurality of lasers, such that each laser output channel is phase and/or frequency locked with respect to at least one other of said plurality of lasers.

One of the advantages of particular embodiments is that a discrete optical comb is obtained without the need for excessively high power laser outputs and only employs a single (optional) wavelength locker for all channels. There is only one optical channel per laser. Because each laser output channel is phase and frequency locked with respect to each adjacent laser the channels cannot drift with respect to each other and thus precise setting and control of the mode/channel spacing is achieved. In addition the necessary frequency orthogonality for OFDM and the additional phase optimization for Coherent WDM is ensured thus minimizing channel crosstalk.

Another advantage is that alignment of the signal to an external frequency grid, such as the ITU recommended grid, is also possible simply by wavelength locking one of the lasers in the usual way. A further advantage is that by avoiding the excess losses associated with separating the modes from an externally generated frequency comb, some embodiments only requires laser sources with a typical power output since there is one laser per output channel and excess losses are minimized. In addition, since only the number of lasers (locked to the adjacent lasers), which are required are employed, multiple side bands are not present. A subsidiary advantage is that the overall power efficiency may be sufficiently enhanced to make the use of a booster amplifier unnecessary.

A further advantage of some embodiments is that that this structure can be fully integrated and thus the physical size of the system is also reduced considerably.

Additional practical advantages arise because the optical comb is created where each channel is separately controlled and this provides a significant advantage over other methods. For example it is possible to choose which channels will be used without the need for external filters. By integrating an optical modulator with each laser, it is possible to encode data onto each channel, and thus create a WDM signal on each channel. By correctly arranging multiple contacts for the laser and modulator, power leveling of individual channels and phase optimization may be readily envisioned without the necessity for additional components, whilst pulse carvers and complex modulators for QPSK and other modulation schemes are also readily integrated. All of these enhancements can be directly integrated into the comb source and do not require an extra de-multiplexer to separate the channels, since the channels are inherently separated with the comb source itself.

In one embodiment, the means for feeding back comprises means for reflecting the modulated signal to said plurality of lasers.

In another embodiment, the plurality of lasers comprises an array of lasers positioned in a cascade arrangement.

In another embodiment, the means for combining comprises a multiplexer configured to receive each optical channel output to provide the combined signal.

In another embodiment, the modulator is an optical modulator. The optical modulator can modulate the combined signal at a multiple of half the desired frequency spacing. It will be appreciated that other multiples can be used In one embodiment said means for separating comprises a de-multiplexer.

Another embodiment comprises means for combining the phase and frequency locked output channel to provide a coherent comb source.

In a further embodiment, there is provided a plurality of optical modulators for receiving a respective phase and frequency locked output channel. In one embodiment, the outputs of the optical modulator are combined to provide coherent WDM signals. The integrated solution allows for the addition of integrated optical modulators, which can be used to either put information on each optical channel (as for CoWDM) or else to select optical channels. This can be useful for the creation of beat signals at different multiples of the channel separation. It can also be useful to select the desired output power for each optical channel.

In another embodiment, there is provided a method for providing a coherent optical comb, comprising the steps of:
arranging a plurality of lasers, each laser having an optical output channel;
combining each optical channel output;
modulating the combined optical channel outputs, to provide a modulated signal;
separating the modulated signals into different channels and fed back to said plurality of lasers, such that each laser output channel is phase and/or frequency locked with respect to at least one other of said plurality of lasers.

In another embodiment, there is provided a method for providing coherent WDM signals or WDM signals, comprising the steps of:
arranging a plurality of lasers, each laser having an optical output channel;
combining each optical channel output;
modulating the combined optical channel outputs, to provide a modulated signal;
separating the modulated reflected signal into different channels and fed back to said plurality of lasers, such that each laser output channel is phase and frequency locked with respect to each adjacent laser;
modulating each of these individual channels with data; and
combining all the modulated optical channels to form a CoWDM signal or WDM signal.

It will be appreciated that integrated phase adjustment can be provided before the final modulator. An Integrated variable optical attenuator (VOA), which is essentially a low speed variable optical modulator, can be used to adjust the power levels on each channel. Both integrated phase adjustment and integrated VOAs can be placed before or after the final optical modulator.

One embodiment provides an integrated device comprising the system for providing a coherent optical comb comprising a plurality of lasers, each laser providing an optical output channel; means for combining each optical channel output; a modulator for modulating the combined optical channel outputs, to provide a modulated signal; and means for feeding back said modulated signal to said plurality of lasers, such that each laser output channel is phase and/or frequency locked with respect to at least one other of said plurality of lasers.

A further embodiment provides an optical source for providing CoWDM, or OFDM, or equivalently Multi-banded OFDM comprising a system for providing a coherent optical comb comprising a plurality of lasers, each laser providing an optical output channel; means for combining each optical channel output; a modulator for modulating the combined optical channel outputs, to provide a modulated signal; and means for feeding back said modulated signal to said plurality of lasers, such that each laser output channel is phase and/or frequency locked with respect to at least one other of said plurality of lasers.

Another embodiment provides a device for providing controllable Tera-Hertz (THz) generation comprising the system as hereinbefore described. The phase relationship between the lasers can be tuned to control the position at which the intensity of the generated THz signal is maximized.

In a further embodiment where stabilization of laser bias is required to ensure adequate natural frequency, optimize output power and phase, there may also be provided a set of instructions or program for causing a computer of similar electronic devices, such as a field programmable gate array to carry out the above method, the instructions for which may be embodied on a record medium, carrier signal or read-only memory.

BRIEF DESCRIPTION OF THE DRAWINGS

Aspects of the invention will be more clearly understood from the following description of an embodiment thereof, given by way of example only, with reference to the accompanying drawings, in which.

DETAILED DESCRIPTION

Figure 1:
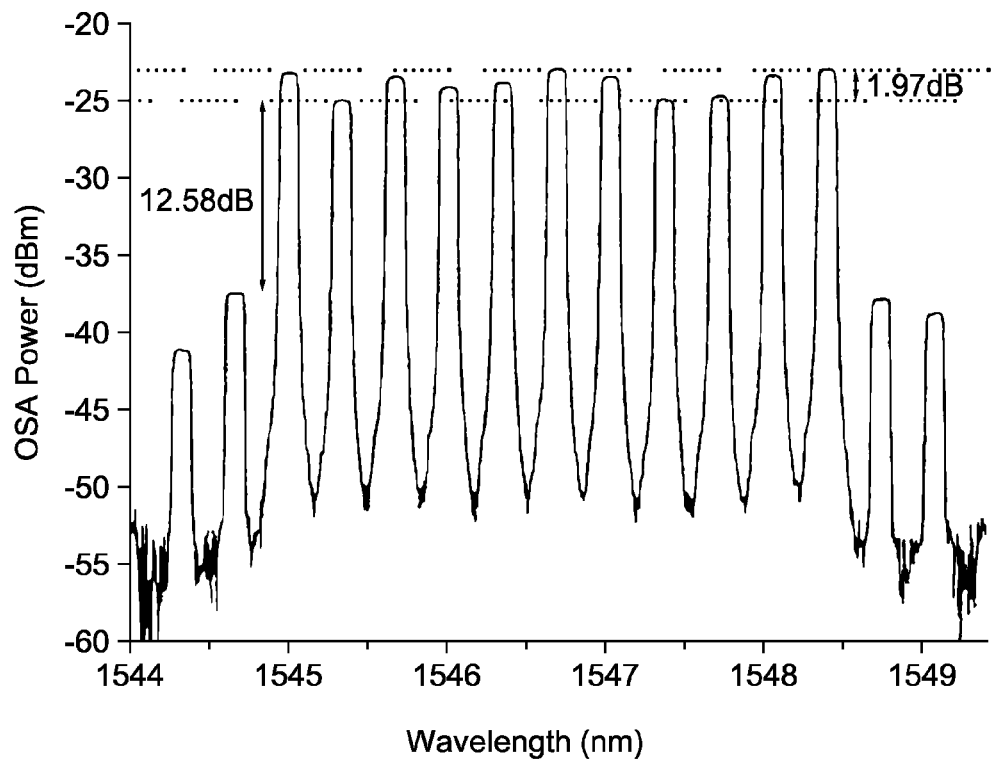
FIG. 1 illustrates a plurality of side bands produced using a prior art single mode laser operating system.
Figure 2:
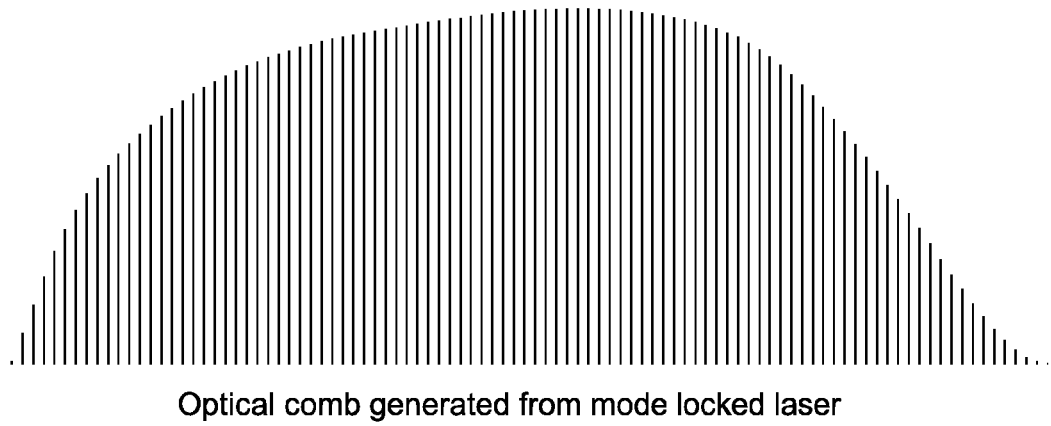
FIG. 2 illustrates an optical comb generated from a typical mode locked laser system.
Figure 3:
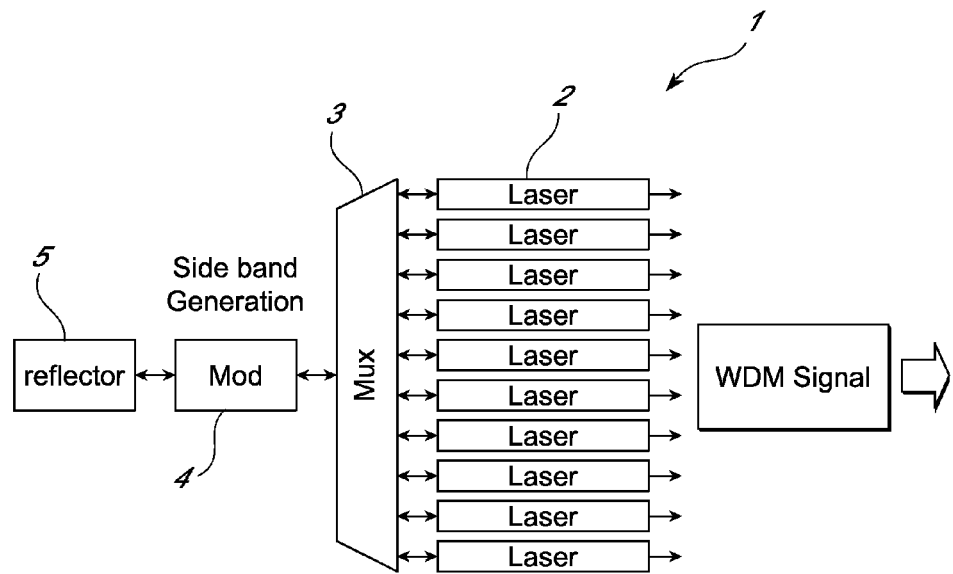
FIG. 3 illustrates one embodiment of the present invention.

Referring to FIG. 3 there is illustrated an embodiment of the present invention for providing a coherent optical comb, illustrated generally by the reference numeral 1. The system provides a plurality, or an array, of lasers 2, that are designed to lase according to a specified frequency spacing. Each laser 2 provides a separate optical output channel. The array of lasers can be positioned in a cascade arrangement, or any other suitable manner. The lasers can be fabricated on the same semiconductor chip, and the wavelengths can be specified through resonant feedback within the device. This can be through a distributed feedback (DFB laser), a distributed Bragg reflector (DBR laser), a multi-cavity laser (such as an etched C cubed laser) or a slotted discrete mode laser. By using feedback that is specified through the fabrication process, it is possible to create an array of lasers where there is a designed frequency spacing between each laser. These on chip lasers can be designed to produce power levels typically in the range of 1-10 mW.

The outputs are combined 3, for example using a multiplexer, and then modulated using a modulator 4. This modulated signal can be reflected using a reflector 5 and then passes back through the same modulator 4, or another modulator. It will be appreciated any feedback mechanism can be used other than the reflector 5. This will result in the signal from each laser 2 being changed into a narrow comb of frequencies. The reflector 4 can be made using a high reflection coating with a cleaved or etched facet. Additionally reflectors can be fabricated using resonant gratings.

The reflected modulated signal is then separated 3, using a separate de-multiplexer (not shown) or using the multiplexer 3 in reverse, into its different frequencies and fed back into the laser array 2. Thus, each laser 2 receives feedback from a number of the neighboring lasers. In this way each laser is phase and frequency locked with respect to each adjacent laser. The side bands of each laser are used to injection lock the adjacent laser. Injection locking of a one laser to a master laser can be achieved using a number of different methods. Frequency matching is assured, along with stable phase relationship between signal injected at laser input and the output laser line. In one embodiment the master laser is optically isolated from other lasers.

Finally, the outputs of the coherent lasers can be combined (not shown) into a single fiber to make a coherent comb.

One embodiment provides an array of at least two lasers, nominally spaced at the desired frequency spacing through appropriate cavity design. Such designs may include, but are not limited to, distributed feedback lasers, distributed Bragg reflector lasers, discrete mode lasers, and variations thereof. Each laser emits from two sides, denoted input and output for clarity of description. Light emitted from the input side are coupled together using either a wavelength (frequency) independent power combiner, or a suitable WDM coupler, and the combined output is fed to an electro-optic modulator.

The modulator generates at least one sideband from the signal originating from each laser, where at least one of the sidebands is shifted in frequency (wavelength) from the original laser frequency (wavelength) by the desired channel spacing. This condition may be achieved from either a single or multiple passes through the modulator. For application of the comb generator to OFDM or Coherent WDM, the modulator is ideally electrically driven by a clock signal oscillating synchronously with the data signals which will be subsequently encoded onto the comb lines. The sidebands generated in this fashion, and any residue of the signals emitted from the lasers, are fed back into the lasers via the power or WDM coupler. The frequency components close to the natural frequency of each laser then injection lock each laser to the desired exact channel spacing.

In one embodiment, one laser, identified as the master laser, injection locks its neighbors, who in turn injection lock their neighbors, and so on until the entire comb is locked to the desired channel spacing. Alternatively, the lasers may mutually injection lock each other. In this case, in order to eliminate the possibility of chaotic behavior, the overall optical path length should be minimized, or quantum dot based lasers which exhibit immunity to such coherence collapse may be employed.

In one embodiment the modulator modulates the combined signal at a multiple of half the desired frequency spacing. It will be appreciated that the multiple could be one quarter if a bi-directional modulator is used in the two side band carrier suppressed condition. The difficulty with anything other than SSB or single pass CS is what impact unwanted sidebands would have.

In a further aspect, the laser outputs are connected to an array of data encoding modulators, the outputs of which are coupled together to produce an OFDM or a Coherent WDM output signal.

Figure 4:
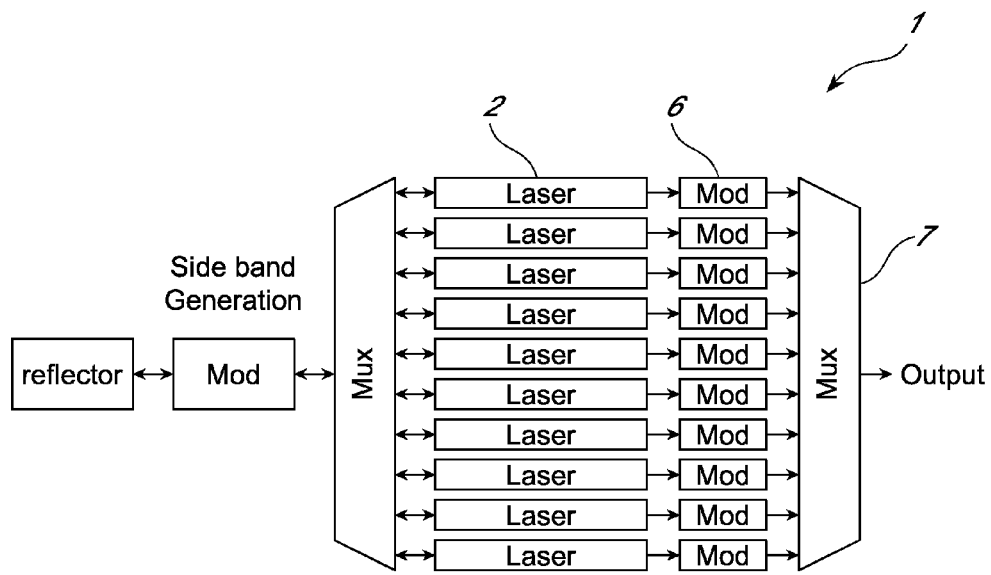
FIG. 4 illustrates a further embodiment of the present invention.

Referring to FIG. 4, there is also shown an array of optical modulators 6, oriented so that each optical channel from each laser source 2 is individually modulated before the optical channels are coupled back into a single waveguide, for example using a multiplexer 7. This can provide for the creation of higher quality coherent WDM signals.

The embodiment shown in FIG. 4 can provide many applications that are desirable in the telecommunication industry. For example, the additional array of modulators that can encode data onto each wavelength for each channel. Each modulator can control the output from one or more lasers. The solution also allows the provider to easily turn off or on individual channels using the modulator array. For example a number of lasers separated by 25 GHz, if 75% are turned off then the remaining channels can operate at 100 GHz spacings.

It will be apparent to those skilled in the field that embodiments disclosed herein may be employed for a variety of applications where spatially separated, orthogonal frequencies are required. For example, in low cost WDM applications such as 100GE [ref IEEE Standard], a locked carrier spacing can eliminate inter-channel frequency drift due to aging or temperature drift in un-cooled applications, enabling operation at lower channel spacing and simple wavelength tracking using a single control parameter, either the above mentioned wavelength locker in the transmitter, or a single centre frequency tuning element for an optical de-multiplexer.

In a second example, if the channel spacing is set in the Terahertz region, embodiments disclosed herein may be used to provide a source of Terahertz signals. If the signals are combined in a single waveguide, then the phase control may be applied to maximize the peak power of the optical signal incident on a Terahertz generating target, and unlike traditional short pulse techniques, the accurate Terahertz spacing of particular embodiments enables a narrowband, tunable Terahertz signal. Similarly, if a free space path is employed from the output of FIG. 3, phase control may be used to spatially translate the region of the target where the beat signal has maximum peak intensity, enabling electronic control of a Terahertz imaging device, in a similar fashion to a monochromatic phased array antenna. It is envisaged that embodiments can be employed in Terahertz applications, for example X-rays in medical or security applications provide novel information in chemistry and biochemistry applications, imaging applications and/or manufacturing applications.

It will be appreciated that there are a number of options for the method of integration. The devices can all be on a single piece of semiconductor, alternatively different types of semiconductors can be integrated together into a single package, and packaged as a single device. It is also envisaged that multiple packages can be used to make up the device to implement embodiments disclosed herein.

It will be further appreciated that particular embodiments provide a very compact integrated source for Coherent WDM.

Embodiments of the de-multiplexer disclosed herein is employed only to allow frequencies close to the desired locked frequency to pass. The de-multiplexer allows for one component to be used for multiple bands. Alternatively, the de-multiplexer can be replaced by a passive power combiner.

In addition, embodiments can be employed using a fixed array of lasers or uses band tunable lasers. Where the main current may be tuned, once injection locked, each laser can tune power and phase. Embodiments disclosed herein can provide additional contacts to tune power and phase either inside the lasing cavity, or at the output of the laser.

In one embodiment the modulator is a single side band modulator, such that each laser only locks one neighbor and no residual light remains (master is at one end of the array, assuming lasers are arranged sequentially) allows for operation.

In another embodiment the modulator generates two sidebands with no residual light at the original laser frequency, such that each laser injection locks both of its neighbors (master is the middle laser) will allow for operation, but each laser is injection locked by two lasers.

In another embodiment the modulator generates two sidebands with such that each laser injection locks both of its neighbors (master is the middle laser) will allow for operation, but each laser is injection locked by two lasers.

In a further embodiment the modulator can generate three or more sidebands, including radiation at the injected frequency. Thus implementation will have a greater possibility of chaotic behavior, although this can be minimized with quantum dots. The laser array typically will have a particular start up sequence.

The modulator can operate unidirectionally by pass path for the "reflection". Modulators which are used bi-directionally, but only modulate in one direction (and are driven at clock frequency or half of the clock frequency). Modulators which are used bi-directionally and modulate in both directions and may also be driven at one quarter of the clock frequency.

The embodiments described with reference to the drawings comprise a computer apparatus and/or processes performed in a computer apparatus to control the array of lasers, including the modulation, combining and reflecting. However, embodiments also include computer programs, particularly computer programs stored on or in a carrier adapted to bring embodiments of the invention into practice. The program may be in the form of source code, object code, or a code intermediate source and object code, such as in partially compiled form or in any other form suitable for use in the implementation of the method. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

Embodiments are not limited to the laser source embodiments hereinbefore described but may be varied in both construction and detail.

The invention claimed is:

1. A system for providing a coherent optical comb comprising:
   a plurality of lasers, each laser providing an optical channel output;
   means for combining each optical channel output before modulating each of said optical channel output;
   a modulator for modulating the combined optical channel outputs, to provide a modulated signal, wherein said modulation defines a frequency spacing between the optical channel outputs;
   means for optically reflecting said modulated signal to said plurality of lasers, such that each laser output is phase and/or frequency locked with respect to at least one other of said plurality of lasers with a frequency difference equal to an integer multiple of the frequency of said modulating signal; and
   an optical modulator positioned to control the operation of at least one of the plurality of laser outputs.

2. The system of claim 1 comprising means for separating the modulated reflected signal into different channels for feedback to each laser such that each laser output is phase and/or frequency locked with respect to at least one other of said plurality of lasers.

3. The system of claim 2 wherein the separating means comprises means to feedback only parts of the reflected signal associated with the at least one of said plurality of lasers such that each laser output is phase and/or frequency locked with respect to the at least one of said plurality of lasers.

4. The system of claim 1 wherein the plurality of lasers comprises an array of lasers positioned in a cascade arrangement such that all lasers are mutually phase and/or frequency locked.

5. The system of claim 1 wherein the means for combining comprises a multiplexer configured to receive each optical channel output to provide the combined signal.

6. The system of claim 1 wherein the modulator is an optical modulator, said optical modulator modulates the combined optical channel outputs at a multiple of half the frequency spacing.

7. The system of claim 1 wherein said means for optically reflecting the modulated signal changes said optical channel output from each laser into a narrow comb of frequencies.

8. The system of claim 2 wherein said means for separating the modulated reflected signal into different channels comprises a de-multiplexer.

9. The system of claim 1 comprising means for combining the phase and frequency locked laser outputs to provide a coherent comb source.

10. A method of providing a coherent optical comb, comprising the steps of:
- arranging a plurality of lasers, each laser having an optical channel output;
- combining each optical channel output before modulating each of said optical channel output;
- modulating the combined optical channel outputs, to provide a modulated signal, wherein said modulation defines a frequency spacing between optical channel outputs;
- separating the modulated signals into different channels;
- optically reflecting the modulated signal to said plurality of lasers with a frequency difference equal to an integer multiple of the frequency of the modulating signal, such that each laser output is phase and/or frequency locked with respect to at least one other of said plurality of lasers; and
- controlling the operation of at least one of the plurality of laser outputs with an optical modulator.

11. A computer program comprising program instructions for causing a computer to control a method of:
- arranging a plurality of lasers, each laser having an optical channel output;
- combining each optical channel output before modulating each of said optical channel output;
- modulating the combined optical channel outputs, to provide a modulated signal, wherein said modulation defines a frequency spacing between the optical output channels;
- separating the modulated signal into different channels;
- optically reflecting the modulated signals to said plurality of lasers with a frequency difference equal to an integer multiple of the frequency of said modulated signal, such that each laser output is phase and/or frequency locked with respect to at least one other of said plurality of lasers; and
- controlling the operation of at least one of the plurality of laser outputs with an optical modulator.

12. An optical source for providing CoWDM, or OFDM, or equivalently Multi-banded OFDM comprising a system for providing a coherent optical comb, said system comprising:
- a plurality of lasers, each laser providing an optical channel output;
- means for combining each optical channel output before modulating each of said optical channel output;
- a modulator for modulating the combined optical channel outputs, to provide a modulated signal, wherein said modulation defines a frequency spacing between the optical channel outputs;
- means for optically reflecting said modulated signal to said plurality of lasers with a frequency difference equal to an integer multiple of the frequency of said modulating signal, such that each laser output is phase and/or frequency locked with respect to at least one other of said plurality of lasers; and
- an optical modulator positioned to control the operation of at least one of the plurality of laser outputs.

* * * * *